(12) United States Patent
Brown et al.

(10) Patent No.: US 10,948,614 B2
(45) Date of Patent: Mar. 16, 2021

(54) IMAGING SYSTEM WITH ONE OR MORE MASK UNITS AND CORRESPONDING METHOD OF RECORDING RADIATION

(71) Applicant: H3D, Inc., Ann Arbor, MI (US)

(72) Inventors: Steven Brown, Ann Arbor, MI (US); Kevin Moran, South Lyon, MI (US)

(73) Assignee: H3D, Inc., Ann Arbor, MI (US)

( * ) Notice: Subject to any disclaimer, the term of this patent is extended or adjusted under 35 U.S.C. 154(b) by 0 days.

(21) Appl. No.: 16/177,769

(22) Filed: Nov. 1, 2018

(65) Prior Publication Data

US 2020/0142084 A1    May 7, 2020

(51) Int. Cl.
*G01T 1/29*    (2006.01)
*G03F 7/20*    (2006.01)

(52) U.S. Cl.
CPC .......... *G01T 1/295* (2013.01); *G03F 7/70775* (2013.01)

(58) Field of Classification Search
CPC ................................. G03F 7/24; G01T 1/295
See application file for complete search history.

(56) References Cited

U.S. PATENT DOCUMENTS

| | | | |
|---|---|---|---|
| 4,595,014 A | 6/1986 | Barrett et al. | |
| 4,995,066 A | 2/1991 | Harding et al. | |
| 5,038,370 A | 8/1991 | Harding et al. | |
| 5,606,165 A | 2/1997 | Chiou et al. | |
| 2008/0095298 A1 | 4/2008 | Shefsky | |
| 2017/0322327 A1* | 11/2017 | Boardman | G01V 5/0016 |

FOREIGN PATENT DOCUMENTS

WO    2015176115 A1    11/2015

OTHER PUBLICATIONS

E. Caroli et al., Coded Aperture Imaging in X- and Gamma-Ray Astronomy, Space Science Reviews, Aug. 6, 1987, pp. 349-403, D. Reidel Publishing Company.
E.E. Fenimore et al., Coded aperture imaging with uniformly redundant arrays, Applied Optics, Feb. 1, 1978, pp. 337-347, vol. 17, No. 3.
Kenneth F. Koral et al., Digital Tomographic Imaging with Time-Modulated Pseudorandom Cooded Aperture and Anger Camera, Journal of Nuclear Medicine, 1975, pp. 402-413, vol. 16, No. 5.

(Continued)

*Primary Examiner* — Yara B Green
(74) *Attorney, Agent, or Firm* — Quinn IP Law (57) ABSTRACT

An imaging system includes a first mask unit having a hollow cavity surrounding a rotational axis. The first mask unit is characterized by a first pattern encoded on its surface. The first pattern defines a height along an axial direction and includes a respective plurality of elements with at least one open element and at least one blocking element in each of the axial direction and the circumferential direction. A detector is configured to receive radiation data from at least one source such that one of the detector and the source is located inside the hollow cavity and another is located outside the hollow cavity. The first mask unit is configured to move relative to the rotational axis in at least one of the axial and circumferential direction until the first pattern is recorded in 360 degrees. A second mask unit may be positioned around the first mask unit.

19 Claims, 7 Drawing Sheets

(56) References Cited

OTHER PUBLICATIONS

Steven T. Brown, et al., Time-Encoded Gamma-Ray Imaging Using a 3D-Position-Sensitive CdZnTe Detector Array, pp. 1-10.
Erik Brubaker, et al., Bubble Masks for Time-Encoded Imaging of Fast Neutrons, Sep. 2013, pp. 1-62, Sandia National Laboratories, Albuquerque, New Mexico and Livermore, California.
European search report for the corresponding European application No. EP19205749.
J. Brennan, et al., "Demonstration of Two-dimensional Time-encoded Imaging of Fast Neutrons", Jul. 27, 2015, p. 1-8.
G. F. Knoll, et. al, "Application of Coded Apertures in Tomographic Head Scanning." Nuclear Instruments and Methods in Physics Research, vol. 221, pp. 226-232, Mar. 1984.
P.M.E.Shutler, et al, "Periodic wrappings in coded aperture imaging." Nuclear Instruments and Methods in Physics Research A, 738 (2014), 132-148.
S. T. Brown,"Time-Encoded Thermal Neutron Imaging Using Large-vol. Pixelated CdZnTe Detectors", Ph.D. thesis, University of Michigan (2017).

\* cited by examiner

IMAGING SYSTEM WITH ONE OR MORE MASK UNITS AND CORRESPONDING METHOD OF RECORDING RADIATION

INTRODUCTION

The present disclosure relates generally to an imaging system and corresponding method of recording radiation with one or more mask units in the imaging system. Coded aperture devices may be employed to block radiation by casting a coded shadow upon a detector and mathematically reconstructing the spatial distribution of the source of radiation from this shadow. However, when forming two-dimensional images, these devices tend to be bulky or compromise image quality to achieve compactness.

SUMMARY

Disclosed herein is an imaging system and a method of recording radiation data. The imaging system including a first mask unit having a hollow cavity surrounding a rotational axis. The first mask unit is characterized by a first pattern encoded on its surface. The first pattern defines a height along an axial direction parallel to the rotational axis. The first pattern includes a respective plurality of elements with at least one open element in each of the axial direction and a circumferential direction and at least one blocking element in each of the axial direction and the circumferential direction (minimum four elements, with at least two open and at least two closed). A detector is configured to receive radiation data from at least one source such that one of the detector and the source is located inside the hollow cavity and another of the detector and the source is located outside the hollow cavity. The first mask unit is configured to move relative to the rotational axis in at least one of the axial direction and the circumferential direction until the first pattern is at least partially recorded.

The first mask unit may be a cylindrical shell. A controller may be in communication with the detector, the controller including a processor and tangible, non-transitory memory on which is recorded instructions for executing a method. Execution of the instructions by the processor causes the controller to reconstruct an image or distribution of the source, the image including respective pixels in the circumferential direction and the axial direction. In one example, the open and blocking elements may each be configured with respective attenuation rates and the difference between the respective attenuation rates of the open element and the blocking element may be at or above 10%.

The detector is configured to be position sensitive. For example, the detector may include a cadmium zinc telluride (CdZnTe) compound with pixelated electrodes. The system may be characterized by an absence of a collimator. In one example, the first pattern is a cyclic-difference-set-based (CDS-based) pattern.

The first pattern may be divided into a first set and a second set, such that at least 50% of the first set and at least 50% of the second set are identical moving the mask only enough to record the basic pattern. The first set and the second set may be tiled on the surface in the axial direction. The imaging system may include an actuator configured to move the first mask unit. In one example, the first pattern extends in a single direction, the first pattern being wrapped around the first mask unit in a slant such that respective positions of the respective plurality of elements forms a helical route. The actuator may be configured to move the first mask unit along the helical route until the first pattern is traversed.

In another example, the first pattern may extend along at least two directions, including the axial direction and the circumferential direction. The actuator may be configured to sequentially rotate the first mask unit along the circumferential direction by 360 degrees. Additionally, the actuator may be configured to incrementally translate the first mask unit along the axial direction until the height of the first pattern is traversed.

In a second embodiment, the imaging system includes a second mask unit concentric with and positioned surrounding the first mask unit. The second mask unit defines a second surface, with the second mask unit being characterized by a second pattern encoded on the second surface. The second pattern includes the respective plurality of elements with another at least one open element in each of the axial direction and the circumferential direction and another at least one blocking element in each of the axial direction and the circumferential direction (total of at least two open and at least two closed elements). The first mask unit is configured to spin relative to the rotational axis at a first frequency and the second mask unit is configured to spin relative to the rotational axis at a second frequency.

The first mask unit and the second mask unit have respective positions indicated by an inner mask azimuth angle ($\varphi_i$) and an outer mask azimuth angle ($\varphi_o$), respectively. The first mask unit and the second mask unit are configured to spin through a combination of positions ($\varphi_i$, $\varphi_o$), with the inner mask azimuth angle ($\varphi_i$) extending from 0 to $2\pi$ and the outer mask azimuth angle ($\varphi_o$) extending from 0 to $2\pi$. In one example, the respective plurality of elements in the first and second patterns are arranged along the same slope angle but with the opposite sign in the first pattern compared to the second pattern. In other words, the first pattern defines a slope angle of alpha ($\alpha$) and the second pattern defines a slope angle of beta ($\beta$), where $\beta = \alpha \ (\pi/2)$. In one example, the slope angle of alpha ($\alpha$) is between 10 and 80 degrees.

The above features and advantages and other features and advantages of the present disclosure are readily apparent from the following detailed description of the best modes for carrying out the disclosure when taken in connection with the accompanying drawings.

DETAILED DESCRIPTION

Figure 1:
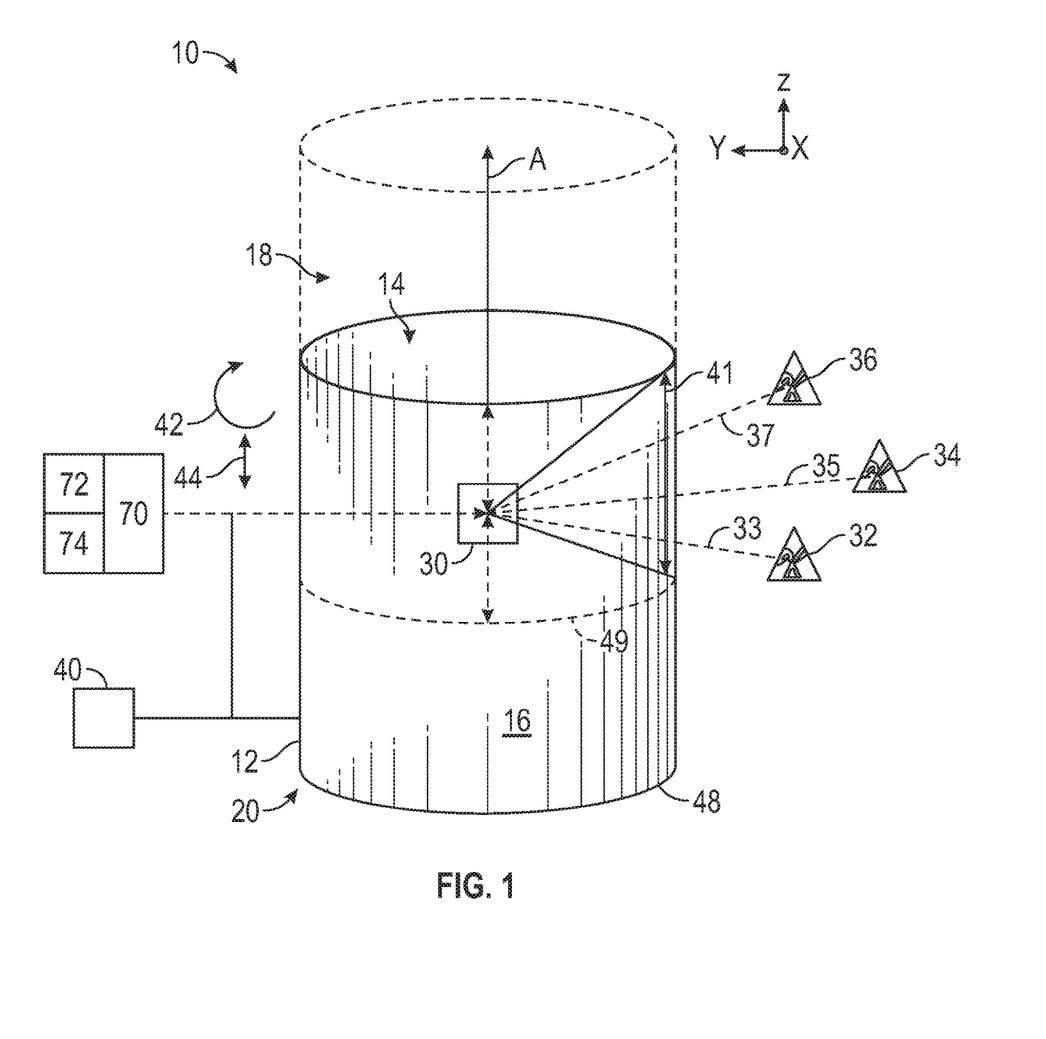
FIG. 1 is a schematic illustration of an imaging system having a first mask unit and a detector, in accordance with a first embodiment.

Referring to the drawings, wherein like reference numbers refer to like components, FIG. 1 schematically illustrates an imaging system 10. The imaging system 10 includes a first mask unit 12 having a hollow cavity 14 defining a rotational axis A. For reference purposes, an XYZ axis is shown in FIG. 1. In the example shown, the rotational axis A is parallel to the Z axis. The first mask unit 12 defines a surface 16 between a first end 18 and a second end 20. In the example illustrated in FIG. 1, the first mask unit 12 has a cylindrical shape. However, it is to be understood that other suitable shapes may be employed. In one example, the rotational axis A is coincident with the center of the hollow cavity 14. In another example, the rotational axis A is off-center, i.e., not coincident with the center of the hollow cavity 14.

Figure 2A:
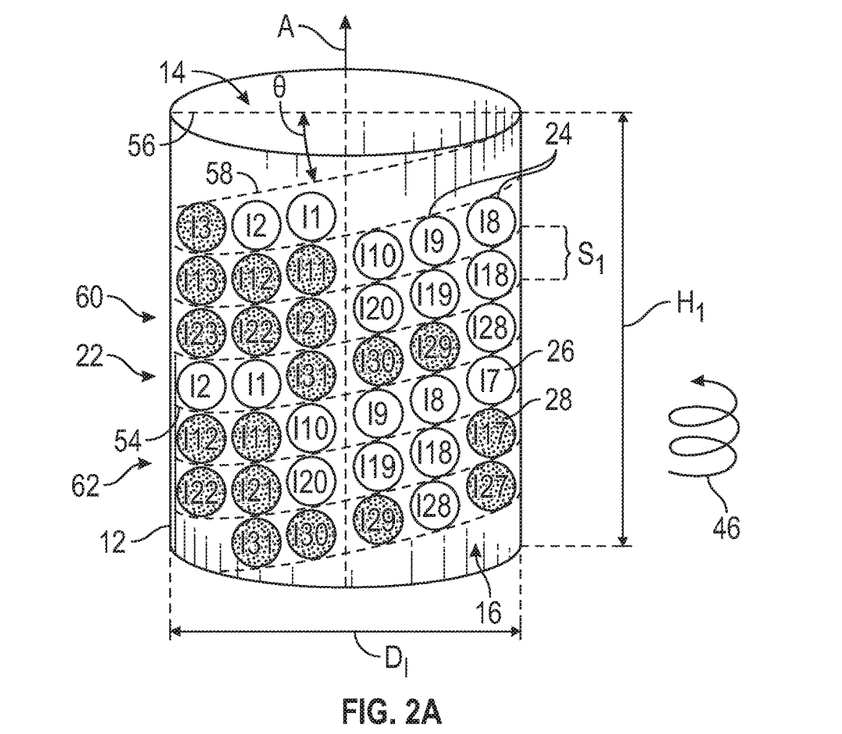
FIG. 2A is a schematic illustration of an example first mask unit employable in the imaging system of FIG. 1.
Figure 2B:
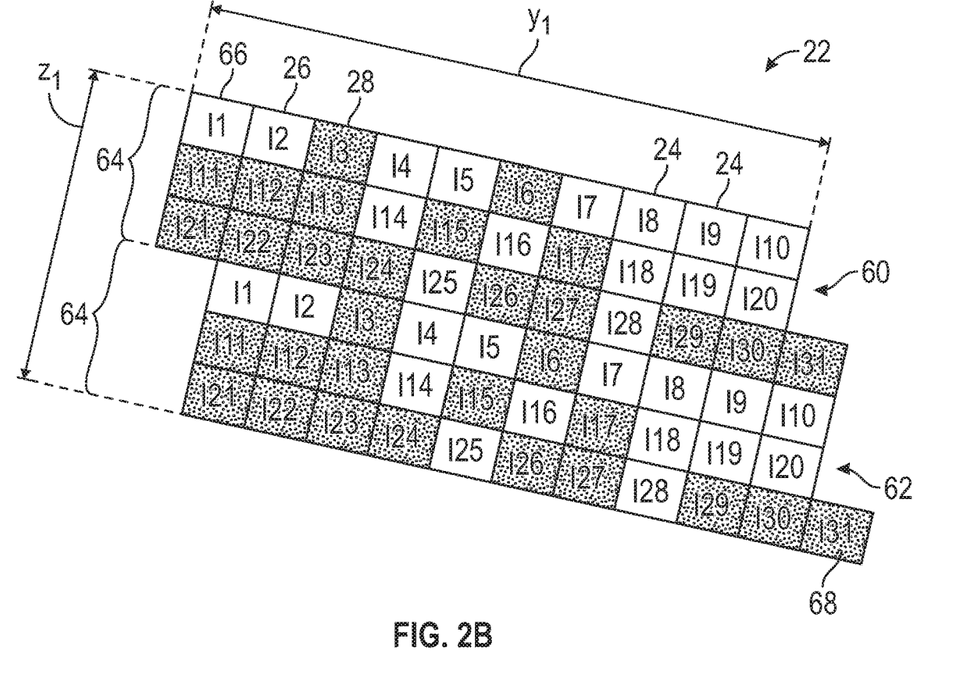
FIG. 2B is the laid-out or flattened first pattern of the first mask unit shown in FIG. 2A.

FIG. 2A illustrates an example first mask unit 12 employable in the imaging system 10, in accordance with a first embodiment. The first mask unit 12 is characterized by a first pattern 22 encoded on the surface 16. FIG. 2B is the laid-out or flattened version of first pattern 22 of the first mask unit 12 of FIG. 2A. For clarity, the first pattern 22 is omitted in FIG. 1. Referring to FIGS. 2A and 2B, the first pattern 22 includes a plurality of elements 24 of varying attenuation, with at least one open element 26 and at least one blocking element 28 (shown shaded in FIGS. 2A and 2B) in each of an axial direction 44 and a circumferential direction 42 (relative to the rotational axis A) and an axial direction 44 (parallel to the rotational axis A). In other words, plurality of elements 24 includes a minimum of four elements, at least two open and at least two closed. The open element 26 may be a through hole in the surface 16 of the mask 12. Alternatively, the open element 26 may be composed of a layer of a dissimilar material. For example, the first mask unit 12 and the blocking element 28 may be composed of tungsten and the open element 26 may be composed of a layer of polymer or glass. The shape and sizes of the plurality of elements 24 may be varied based in the application at hand, including but not limited to, circles, squares and rectangles.

Figure 3A:
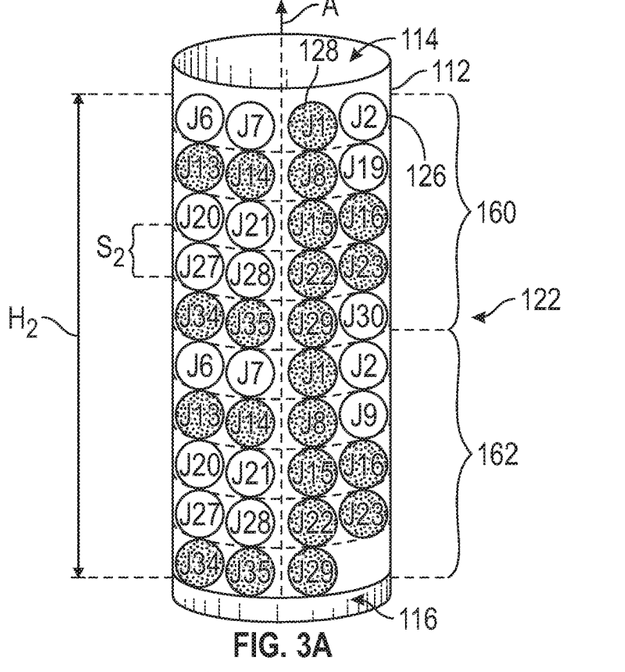
FIG. 3A is a schematic illustration of another example first mask unit employable in the imaging system of FIG. 1.

The respective attenuation rates of the open element 26 and the blocking element 28 may be varied based on the application at hand. In one example, the open element may be configured to have a respective attenuation rate at or below 10%, and the blocking element may be configured to have a respective attenuation rate at or above 80%. In another example, the open element 26 may be configured to have an attenuation rate at or below 1% such that the open element 26 allows 99% or more of incoming radiation to pass through it and the blocking element 28 may be configured with an attenuation rate at or above 95%. A second example of a first mask unit 112 employable in the imaging system 10 is shown in FIG. 3A and described below.

Referring to FIG. 1, the imaging system 10 includes a detector 30 configured to receive radiation data from at least one source, such as first source 32. One of the detector 30 and the first source 32 is located inside the hollow cavity 14 and another of the detector 30 and the first source 32 is located outside the hollow cavity, such that the radiation data travels through the first mask unit 12 from the first source 32 to the detector 30. If there is more than one source (for example, a second source 34 and a third source 36) and the detector 30 is positioned inside the hollow cavity 14, then all the sources are to be positioned outside the hollow cavity 14. If the detector 30 is positioned outside the hollow cavity 14, then all the sources are to be positioned inside the hollow cavity 14. The first source 32, second source 34 and third source 36 may emit any type of radiation phenomenon known to those skilled in the art, including but not limited to, alpha, beta, electromagnetic radiation and neutrons. The detector 30 and the first mask unit 12 may be independently movable. It is to be understood that the imaging system 10 may take many different forms and include multiple and/or alternate components and facilities. Recording the shadow of a moving mask as opposed to a fixed mask offers additional resolvable image pixels, thereby enhancing image quality.

Referring to FIG. 1, an actuator 40 is operatively connected to or in electronic communication with and configured to move the first mask unit 12. In one example, the actuator 40 is an electric motor. The actuator 40 may be a linear actuator, a rotary actuator, a stepper motor, a shape memory alloy or other type of actuator available to those skilled in the art. Referring to FIG. 1, the actuator 40 is configured to shift the first pattern 22 (see FIGS. 2A, 2B) relative to the rotational axis A in at least one of the circumferential direction 42 and the axial direction 44 until the first pattern 22 is recorded in 360 degrees in a field of view 41 (see FIG. 1) and the height $Z_1$ (see FIG. 2B) of the first pattern 22 is traversed. This traversal may be accomplished in a number of ways. Firstly, referring to FIG. 2A, the first mask unit 12 may be moved along a helical route 46. Secondly, referring to FIG. 1, this traversal may be accomplished by sequentially rotating or spinning the first mask unit 12 by 360 degrees, and incrementally translating the first mask unit 12 along the axial direction 44, from a first mask position 48 to a final mask position 49. The sequence of rotation by 360 degrees and incremental translation is repeated until the whole first pattern 22 is sampled.

Figure 4:
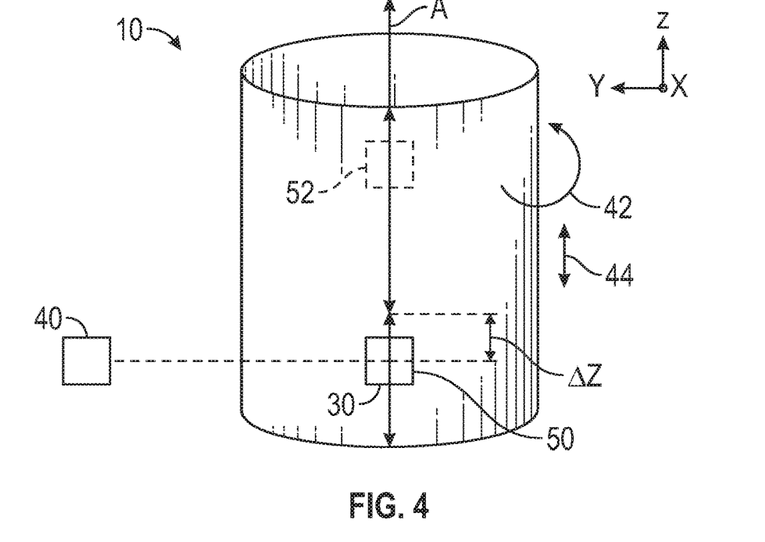
FIG. 4 is a schematic illustration of the imaging system of FIG. 1, showing displacement of the detector.

Alternatively, the detector 30 may be translated instead of the first mask unit 12. Thirdly, referring to FIG. 4, this traversal may be accomplished by sequentially rotating the first mask unit 12 by 360 degrees in a circumferential direction 42, and incrementally translating the detector 30 by a displacement ($\Delta z$) along an axial direction 44 (parallel to the rotational axis A). Referring to FIG. 4, the sequence continues until the entire first pattern 22 is sampled, with the detector 30 moving from a first detector position 50 to a final detector position 52.

In the example shown in FIG. 2A, the first pattern 22 extends along a single direction and is one-dimensional. The first pattern 22 is wrapped or encoded around the first mask unit 12 in a slant 54 such that respective positions of the plurality of elements 24 form a helical route 46. Referring to FIG. 2A, the slant 54 is characterized by a slant angle $\theta$ between a reference plane 56 perpendicular to the rotational axis A, and a reference line 58. The reference line 58 is tangential to the slant 54 and intersects the reference plane 56. The one directional first pattern of FIG. 2A is arranged in two dimensions in FIG. 2B such that each row includes the plurality of elements 24 for one revolution (ten elements per revolutions in this example).

Referring to FIG. 2B, the first pattern 22 defines a height $Z_1$ and a width $Y_1$. The actuator 40 of FIG. 1 may be configured to move the first mask unit 12 along the helical route 46 (see FIG. 2A) that traces the one-dimensional first pattern 22 wrapped around the mask 12 until the height $Z_1$ and width $Y_1$ (see FIG. 2B) of the first pattern 22 is traversed. Referring to FIG. 2A, to ensure adequate sampling, the incremental distance between revolutions along the helical route 46 is selected to be less than or equal to the element pitch (shown as separation $S_1$ in FIG. 2A) of the plurality of elements 24 along the Z direction. The length $H_1$ of the first mask unit 12 is chosen to be greater than the height $Z_1$ of the first pattern 22. The diameter $D_1$ of the first mask unit 12 may be chosen such that:

$$Y_1 = \text{Square root}(S_1^2 + \pi^2 D_1^2).$$

Referring to FIG. 2A, the first pattern 22 includes a first set 60 and a second set 62, with the first set 60 and the second set 62 being tiled on the surface 16 in a direction parallel to the rotational axis A. The first set 60 and the second set 62 each may include a portion of the base set 64 characterized by a plurality of members (such as I1, I2, I3 . . . I31 in FIG. 2A) between a first member 66 (block numbered I1 in FIGS. 2A and 2B) and a last member 68 (block numbered I31 in FIGS. 2A and 2B). In one example, the first set 60 (elements 1, 2, 3 . . . n−1, n) and the second set 62 (elements 1, 2, 3 . . . n−1, n) are identical. Here the first pattern 22 includes the base set 64 repeated once for a total of 2n elements (1, 2, 3 . . . n−1, n, 1, 2, 3 . . . n−1, n). In another example, the first set 60 may include the base set 64 without the first member 66 and the second set 62 may include the base set 64 without the last member 68, with the first pattern 22 thus encoding the following plurality of elements 24: (2, 3, . . . n−1, n, 1, 2, 3, . . . n−1). It is to be understood that the first pattern 22 is not limited to the number and sequence shown in FIGS. 2A, 2B, which is intended to be a non-limiting example. The base set 64 is shifted cyclically because the end of the first set 60 meets with the start of the identical second set 62 (I1, . . . I31, I1, . . . I31).

As noted above, in the example shown in FIGS. 1 and 2A, the actuator 40 may be configured to move the first mask unit 12 helically until the first pattern 22 is fully sampled. Referring to FIG. 1, the first source 32 emits radiation along a first source direction 33, inducing a time-varying signal according to the first pattern 22 that traverses the first source direction 33. Other sources modulated by the first mask unit 12 will generate that same one-dimensional first pattern 22 over time, but shifted according to source direction. The second source 34 and the third source 36 emit radiation along a second source direction 35 and a third source direction 37, respectively, inducing a respective time-varying signal according to the first pattern 22 that traverses those respective directions. The signal from the second source direction 35 is delayed by one element from the third source direction 37, while the signal from the first source direction 33 is advanced by one revolution from the second source direction 35. The shift is cyclic because the base set 64 in the first pattern 22 is serially repeated at least once along its helical route 46.

The radius, height, thickness and material of the first mask unit 12 and the respective diameters, number of elements and relative sizes of the plurality of elements 24 may be selected based on the application at hand. For gamma rays, high-density, high-Z materials may be used for the first mask unit 12. For fast neutrons, high-density, low-Z material may be used for the first mask unit 12. For thermal neutrons, a material with high cross section (such as B-10 or Cd-113) may be employed. Optimal choice of parameters for the first mask unit 12 may depend on particle type, detector, desired field of view, desired resolution and other factors.

Referring to FIG. 1, the imaging system 10 includes a controller 70 in electronic communication with the detector 30 and the actuator 40. Referring to FIG. 1, the controller 70 includes at least one processor 72 and at least one memory 74 (or any non-transitory, tangible computer readable storage medium) on which are recorded instructions for executing method 200, shown in FIG. 5 and described below. The memory M can store controller-executable instruction sets, and the processor P can execute the controller-executable instruction sets stored in the memory M. The controller 70 of FIG. 1 is specifically programmed to execute the steps of the method 200.

As described below, the controller 70 is configured to reconstruct an image or distribution of the at least one source based at least partially on the radiation data. The controller 70 may be configured to record a respective sequence of counts (e.g., 1=counts and 0=no counts) as a function of time or spatial location. The controller 70 may be configured to control the operation of the detector and as well as acquisition, processing and storage of the radiation data. The controller 70 may be an integral portion of the detector 30, or a separate module in communication with components of the detector 30.

The detector 30 of FIGS. 1 and 4 may be configured to be time-sensitive and record the radiation data as a function of time. The detector 30 may include a spectrometer that detects distribution of intensity (counts) of radiation versus the energy of the respective radiation. It is to be appreciated that the detector 30 may include associated circuitry or electronics (not shown) appropriate to the application at hand. For instance, the circuitry may include a photomultiplier tube, a silicon photodiode, other photon-electron conversion devices, high voltage supply, preamplifier, amplifier and analog to digital converter (ADC).

In one example, the detector 30 is position sensitive. The detector 30 may include a semiconductor, such as for example, a cadmium zinc telluride (CdZnTe) compound. Any sensor technology available to those skilled in the art may be employed for the detector 30. The detector 30 may include a Compton camera which utilizes Compton scattering to determine the spatial origin of the observed radiation. The respective positions of the first source 32, second source 34 and third source 36 may be described or specified based on their respective polar angle measured from the Z axis, and respective azimuth angle of their orthogonal projection (on the XY plane that passes through the origin and orthogonal to the Z-axis), measured from the X-axis. The respective positions of the first source 32, second source 34 and third source 36 may be specified as a 2D direction vector, a 3-D position or with any other system of reference known to those skilled in the art.

Figure 3B:
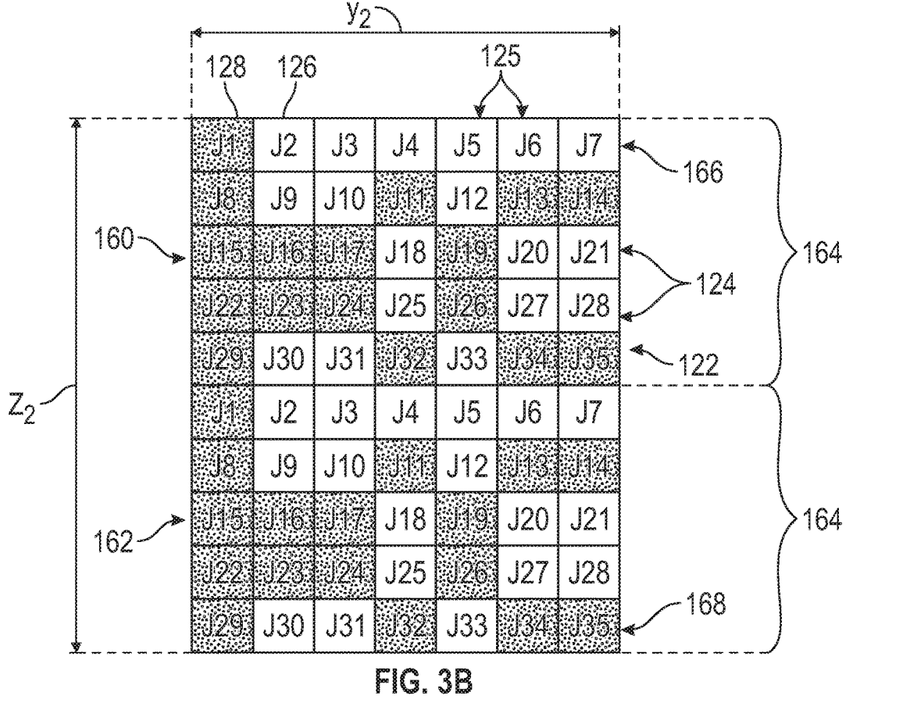
FIG. 3B is the laid-out or flattened first pattern of the first mask unit of FIG. 3A.

FIG. 3A illustrates another example first mask unit 112 employable in the imaging system 10. The first mask unit 112 includes a hollow cavity 114 surrounding a rotational axis A. The first mask unit 112 is characterized by a first pattern 122 encoded on the surface 116. FIG. 3B is the laid-out or flattened version of first pattern 122 of the first mask unit 112 of FIG. 2A. While the first mask unit 112 has a cylindrical shape in the example illustrated in FIG. 3A, it is to be understood that other suitable shapes may be employed. Similar to the first embodiment, the first pattern 122 includes a plurality of elements of varying attenuation, with at least one open element 126 and at least one blocking element 128 (shown shaded in FIGS. 3A and 3B) in each of the circumferential direction 42 (see FIG. 1) and the axial direction 44. The open element 126 may be a through hole in the surface 116 or may include a dissimilar layer.

Referring now to FIG. 3A, the first pattern 122 extends along at least two directions, including a first direction (Z axis) parallel to the rotational axis A and a second direction circumferential (on the surface 16) relative to the rotational axis A. The first pattern 122 includes a first set 160 and a second set 162, with the first set 160 and the second set 162 being tiled on the surface along a direction (Z axis) parallel to the rotational axis. It is to be understood that the first pattern 122 is not limited to the number and sequence shown in FIGS. 3A, 3B, which is intended to be a non-limiting example.

Referring to FIGS. 3A and 3B, the first set 160 and the second set 162 each may include a portion of the base set 164 characterized by a plurality of rows 124 and a plurality of columns 125. In one example, the first set 160 (5 rows by 7 columns, blocks J1, J2, J3 . . . J35) and the second set 62 (5 rows by 7 columns, blocks J1, J2, J3 . . . J35) are identical, with the first pattern 122 encoding the base set 164 repeated once (10 rows by 7 columns, encoding elements J1, J2, J3 . . . J35, J1, J2, J3 . . . J35).

Alternatively, the first set 160 and the second set 162 each may include a portion of a base set 164. In one example, the first set may include the base set 164 without the first row 166 and the second set 162 may include the base set 164 without the last row 168, with the first pattern 122 encoded as follows: (J8, J9, J10 . . . J35, J1, J2, J3 . . . J28). In another example, the first set may include the base set 164 without the first row 166 and the second set 162 may include the entire base set 164, with the first pattern 122 encoded as follows: (J8, J9, J10 . . . J35, J1, J2, J3 . . . J35).

Referring to FIG. 3B, the first pattern 122 defines a height Z2 and a width Y$_2$. The actuator 40 of FIGS. 1 and 4 may be configured to shift the first pattern 122 until the height Z2 and width Y$_2$ of the first pattern 122 is traversed. In one example, the first mask unit 112 is sequentially rotated 360 degrees and the first mask unit 112 is incrementally translated (as shown in FIG. 1) along the rotational axis A to sample the first pattern 112. In another example, the first mask unit 112 is sequentially rotated 360 degrees and the detector 30 is incrementally translated (as shown in FIG. 4) along the rotational axis A to scan a complete cycle of the first pattern 112. To ensure adequate sampling, the incremental translation between revolutions along the rotational axis A is selected to be less than or equal to the element pitch or separation S2 (see FIG. 3A) between rows 124 along the Z direction. The length H2 of the first mask unit 112 is chosen to be greater than the height Z2 of the first pattern 122. The diameter D2 (not labeled in FIG. 3A) of the first mask unit 112 may be chosen based on the width Y$_2$ of the first pattern 122 such that:

$Y_2 = \pi * D_2$

Figure 5:
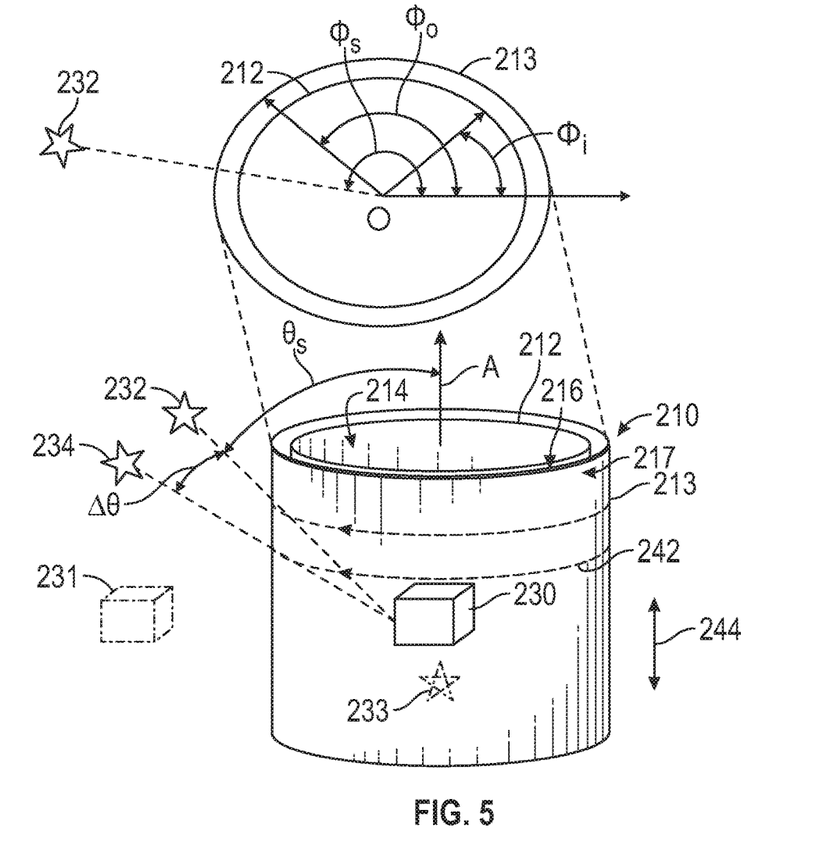
FIG. 5 is a schematic illustration of an imaging system in accordance with a second embodiment, the imaging system having a first mask unit, a second mask unit and a detector.

Referring now to FIG. 5, an imaging system 210 in accordance with a second embodiment is described. The imaging system 210 includes a first mask unit 212 with a hollow cavity 214 surrounding a rotational axis A. A second mask unit 213 is concentric with and surrounds the first mask unit 212. In the example illustrated in FIG. 5, the first and second mask units 212, 213 are cylindrical shells, however, it is to be understood that other suitable shapes may be employed. As in the previous embodiments, the first and second mask units 212, 213 are characterized by patterns encoded on their respective surfaces 216, 217.

Referring to FIG. 5, a detector 230 may be positioned in the hollow cavity 214 and configured to receive radiation data from at least one source, such as first source 232, and second source 234, outside of the first and second mask units 212, 213 with the respective signals travelling through both the first and second mask units 212, 213. The first source 232 and second source 234 may emit any type of radiation phenomenon known to those skilled in the art. Alternatively, the positions may be reversed such that the sources are positioned inside the hollow cavity 214 and the detector 230 is positioned outside the exterior-most mask unit (if there are more than one mask units). For example, a third source 233 may be positioned in the hollow cavity 214 and configured to transmit the radiation data to a detector 231 positioned outside of both the first and second mask units 212, 213.

Figure 6:
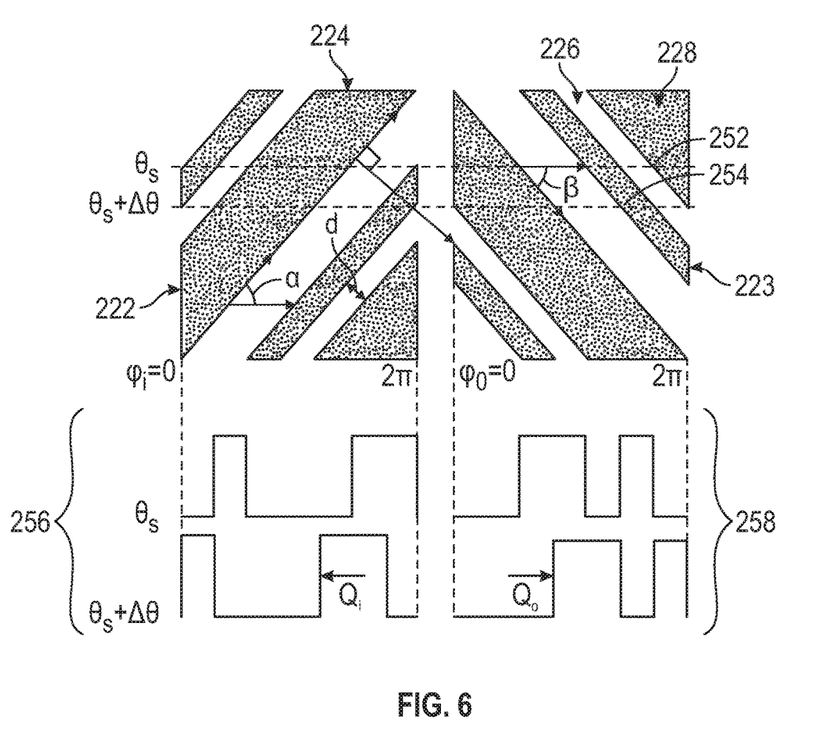
FIG. 6 is a schematic illustration of an example first pattern and an example second pattern employable in the first mask unit and second mask unit of FIG. 5, respectively.

FIG. 6 shows an example first pattern 222 and an example second pattern 223 employable in the first mask unit 212 and second mask unit 213, of FIG. 5, respectively. Similar to the embodiment described relative to FIGS. 2A and 3A, the first pattern 222 and second pattern 223 include a plurality of elements 224 of varying attenuation, each having at least two open elements 226 and at least two blocking elements 228 (shown stippled in FIG. 6). The plurality of elements 224 may include through holes of different sizes and different shapes.

Referring to FIG. 5, the positions of the first source 232 defines a source azimuth angle ($\varphi_s$) and a source polar angle ($\theta_s$). The second source 234 is shifted relative to the first source 232, at a shifted source polar angle ($\theta_s + \Delta\theta$). Alternatively, the second source 234 may represent the first source 232 at a different time (a moving source). Referring to FIG. 5, the positions of the first mask unit 212 and second mask unit 213 may be represented by an inner mask azimuth angle ($\varphi_i$) and an outer mask azimuth angle ($\varphi_o$), respectively, measured relative to an origin O. The first mask unit 212 is configured to spin relative to the rotational axis A at a first frequency and the second mask unit 213 is configured to spin relative to the rotational axis A at a second frequency. The first frequency may be different from the second frequency. The first mask unit 212 and the second mask unit 213 are rotated such that various combinations of positions ($\varphi_i, \varphi_o$) are sampled, with the inner mask azimuth angle ($\varphi_i$) extending from 0 to $2\pi$ and the outer mask azimuth angle ($\varphi_o$) extending from 0 to $2\pi$.

Referring to FIG. 6, the respective plurality of elements 224 may be arranged along a slope angle of alpha ($\alpha$) in the first pattern 212 and along a slope angle of beta ($\beta$) in the second pattern 223, where $\beta = \alpha - (\pi/2)$. In one example, the slope angle positive alpha ($\alpha$) is between 10 and 80 degrees. Here, d is the width of the pattern in a direction perpendicular to the slope angle. FIG. 6 illustrates a first signal set 256 showing the respective signals passing through the first pattern 222, and the second signal set 258 showing the respective signals passing through the second pattern 223. Line 252 denotes a travel path for a signal emanating from the source polar angle ($\theta_s$). Line 254 denotes a travel path for a signal emanating from the shifted source polar angle ($\theta_s + \Delta\theta$). In both of the first signal set 256 and the second signal set 258, the respective signals emanating from the shifted source azimuth angle ($\theta_s + \Delta\theta$) are shifted relative to the source polar angle ($\theta_s$) see first signal shift $Q_i$ and second signal shift $Q_o$ in FIG. 6. However, the signals traveling through the first mask unit 212 and the second mask unit 213 are shifted in opposite directions. In other words, the first signal shift $Q_i$ is opposite to the second signal shift $Q_o$.

Figure 7A:
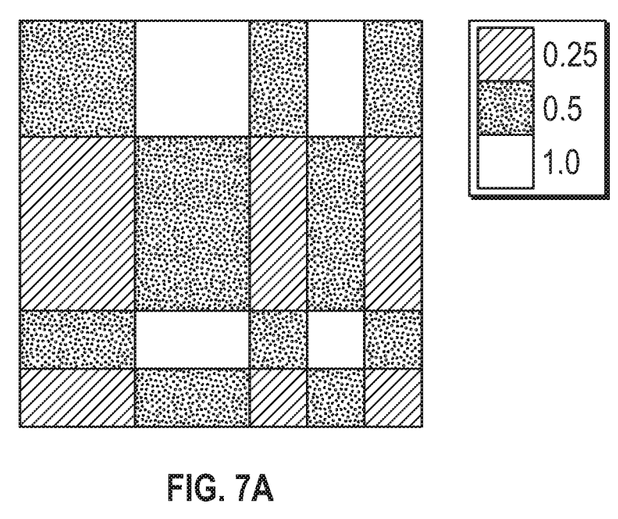
FIG. 7A is a schematic illustration of a time varying shadow from a point source at ($\varphi=0$, $\theta=\theta_s$), the shadow being formed with the patterns of FIG. 6.
Figure 7B:
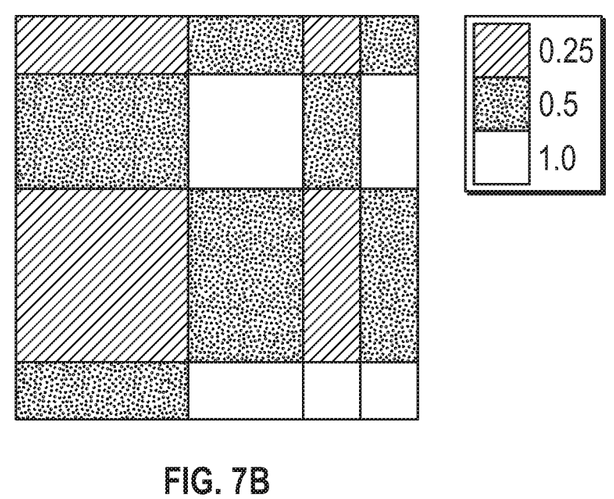
FIG. 7B is a schematic illustration of a time varying shadow from a point source at ($\varphi=0$, $\theta=\theta_s+\Delta\theta$), the shadow being formed with the patterns of FIG. 6.

Radiation data reaching the detector 230 (see FIG. 5) travels through 3 possible states of transmission, including a first state of about zero thickness (encountering open elements 226 in both the first mask 212 and the second mask 213), a second state of a single mask thickness (encountering a blocking element 228 in one of the first mask 212 and the second mask 213 and an open element 226 in the other of the first mask 212 and the second mask 213), and a third state of double mask thicknesses (encountering blocking elements 228 in both the first mask 212 and the second mask 213). FIG. 7A is a schematic illustration of a time varying shadow from a point source at ($\varphi$=0, $\theta$=$\theta_s$), the shadow being formed with the patterns of FIG. 6. FIG. 7B is a schematic illustration of a time varying shadow from a point source at ($\varphi$=0, $\theta$=$\theta_s$+$\Delta\theta$), the shadow being formed with the patterns of FIG. 6. The blank portions of FIGS. 7A and 7B represent the first state of transmission described above (fraction of transparency of 1.0, see legend). FIGS. 7A and 7B also show the second state of a single mask thickness (fraction of transparency of 0.5, see legend) and the third state of double mask thickness (fraction of transparency of 0.25, see legend). In FIGS. 7A and 7B, the left vertical border represents the inner mask azimuth angle ($\varphi_i$) extending from 0 to $2\pi$ and bottom horizontal border represents the outer mask azimuth angle ($\varphi_o$) extending from 0 to $2\pi$.

Figure 8:
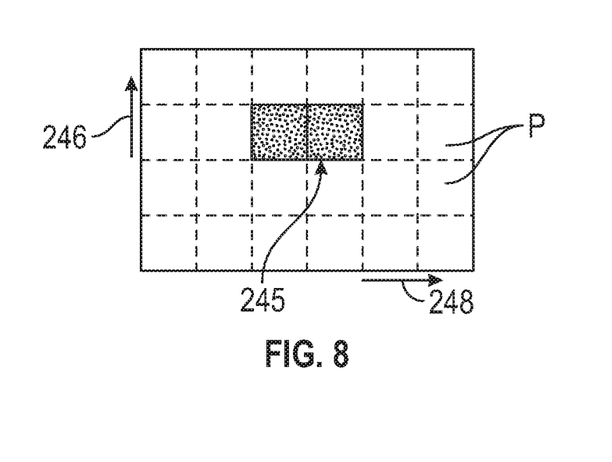
FIG. 8 is a schematic illustration of a reconstructed image formed with the patterns of FIG. 6.

FIG. 8 is a schematic illustration of a reconstructed image formed by the first pattern 222 and second pattern 223 of FIG. 6. The image is reconstructed from periodic correlation with a decoding pattern matched to the fraction of transparency. A peak intensity is detected at point 245. The respective pixels P along the first axis 246 may represent decoded radiation data spanning the 2D space at least partially represented by the circumferential direction 242. The respective pixels P along the second axis 248 may represent decoded radiation data spanning the 2D space at least partially represented by the axial direction 244.

Figure 9:
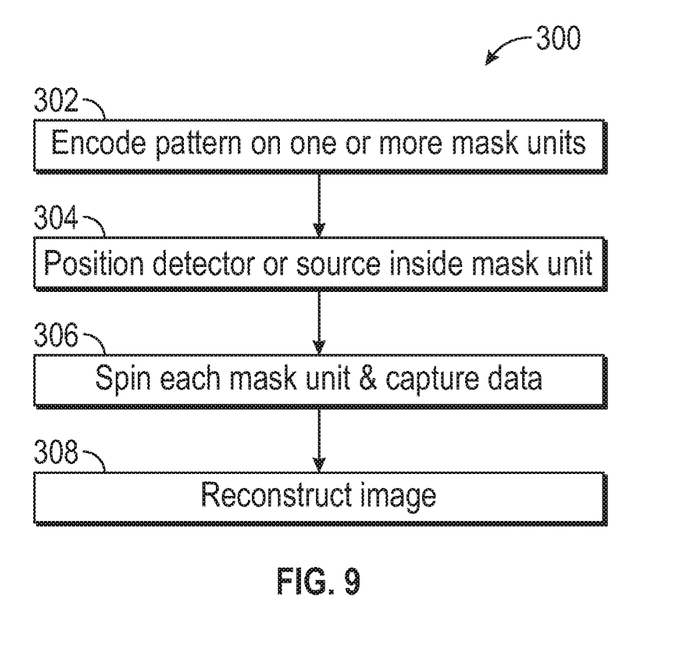
FIG. 9 is a flowchart of a method of recording radiation with one or more mask units.

Referring now to FIG. 9, a flowchart of the method 300 stored on and executable by the controller C of FIG. 1 is shown. Method 300 need not be applied in the specific order recited herein. Furthermore, it is to be understood that some steps may be eliminated. The method 300 may begin with block 302, where one or more mask units are formed with a hollow cavity and encoding a pattern on their respective surfaces, as described in the embodiments shown in FIGS. 1-8. For example, referring to FIGS. 2A and 3A, the first mask unit 12, 112 is formed with a hollow cavity 14, 114, respectively defining a rotational axis A, and a first pattern 22, 122 is encoded on the surface 16, 116, as described in detail above. The first pattern 22, 122 defines a respective height $Z_1$, $Z_2$ shown in FIGS. 2B and 3B respectively.

Per block 304 of FIG. 9, a detector is configured to receive radiation data from at least one source such that one of the detector and the at least one source is located inside the hollow cavity and another of the detector and the at least one source is located outside the hollow cavity of the exteriormost mask. Per block 306 of FIG. 9, the first mask unit 12, 112, 212 (and the second mask unit 213) is configured to shift relative to the rotational axis A. For example, referring to FIG. 1, the first pattern 22, 122 is shifted relative to the rotational axis A, via the actuator 40, in at least one of a circumferential direction 42 and an axial direction 44 until the first pattern 22, 122 is recorded in 360 degrees and the respective height $Z_1$, $Z_2$, shown in FIGS. 2B and 3B respectively, are traversed. The radiation data emanating from the at least one source is recorded, via the detector 30.

Per block 308 of FIG. 9, the controller C is configured to reconstruct an image or distribution of the at least one source based at least partially on the radiation data. The image includes respective pixels P in both the circumferential direction 42 and the axial direction 44. The first mask unit 12, 112, 212 and second mask unit 213 described above encode the distribution of detected particles with a uniquely identifying code that depends on incident particle direction. The measurement data includes the linear sum of codes from each direction with weights proportional to their corresponding source intensities. In one example, a 3-D array A may be defined as: $(A \in [0, 1]^{P \times R \times Q})$, The elements of the 3-D array A are proportional to the probability a particle emitted from the qth source direction is counted by the pth detector element during the rth time interval. The 3-D array A may be calculated at least partially based on the first pattern 22, 122, 222, second pattern 223 and the detector geometry at each time step. The expected value of a time-varying signal measured by the pth detector element may be described as:

$$A_{p**} \cdot \chi + E[B_{p*}^T],$$

where $\chi$ is a column vector with Q elements describing emission rates, B is a P by R matrix of counts due to an un-modulated background, and $E[B_{p*}^T]$ is the expected value of the pth slice of the B matrix. Here the R by Q sub-matrix $A_{p**}$ is the pth slice of the 3-D array A, which may be obtained via a calibration process with a known source, design-of-experiment (DOE), statistical and optimization methods, and other methods available to those skilled in the art. An estimate of $\chi$ may then be calculated from each respective time-varying signal then summed over all P detector elements to form an overall radiation image. The final step involves forming the image, which may be done with periodic correlation or other type of autocorrelation. For example, a decoding pattern may be employed.

In one example, the first pattern 22, 122 may be a cyclic-difference-set-based (CDS-based) pattern. Referring to FIGS. 2A and 3A, the first pattern 22, 122 may be characterized by a base set 64, 164 that is repeated at least once, as described above. The base set 64, 164 may be chosen such that number of occurrences of each hole-to-hole distance within the respective base set 64, 164 and across two neighboring base sets 64, 164 is approximately constant for all distances greater than zero. The hole-to-hole distance is defined as the center-to-center distance between holes and expressed as an integer number of pattern elements. This distance is measured in the direction of the pattern, e.g., along the helical route for the 1D base set shown in FIGS. 2A and 2B. For the 2D patterns (shown in FIGS. 3A, 3B) in the first embodiment, distance is measured along both vertical and horizontal pattern directions separately, i.e., the hole-to-hole distance (3,4) is unique from (4,3). For the 1D patterns of the second embodiment shown in FIG. 6, distances are considered separately for each mask unit 212, 213 along the two directions defined by alpha or beta.

Collimators are generally employed to restrict a field of view of the detector. More specifically, collimators are used to prevent cross talk between pattern rows. Avoiding cross talk is an important issue for uniformly redundant patterns. The systems 10, 210 may be characterized by an absence of a collimator that restrict an axial field of view of the detector. In other words, the systems 10, 210 do not require any collimators to prevent cross talk. The features provided in systems 10, 210 are a way to avoid this type of cross talk without having to use collimators. This may be achieved with the following embodiments. In a first example, a single mask with both axial motion 44 and circumferential motion 42 is employed, with any detector type. In a second example, a single mask with only circumferential motion 42 is employed, along with a detector 30 that is position-sensitive.

This example does not require axial motion due to the position-sensitive detector, as long as the axial extent of that detector is tall enough to record the entire "height" of the mask shadow, then a detector can record the circumferential part of the mask pattern as a function of time and the axial part of the mask pattern as a function of position. In a third example, multiple masks are employed with only circumferential motion, and with any type of detector.

While a non-limiting example is briefly described above, it is to be understood that other methods available to those skilled in the art may be employed. The controller C (and execution of the method 300) improves the functioning of the imaging systems 10, 210 by effectively pinpointing the location of one or more sources with a compact and portable system. The imaging systems 10, 210 are particularly effective for radiation imaging of particles that are more easily attenuated than focused.

The controller C includes a computer-readable medium (also referred to as a processor-readable medium), including any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with first patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. In other words, elements of various embodiments may be combined. Accordingly, such other embodiments fall within the framework of the scope of the appended claims.

What is claimed is:

1. An imaging system comprising:
a first mask unit having a surface and a hollow cavity surrounding a rotational axis;
wherein the first mask unit is characterized by a first pattern encoded on the surface, the first pattern defining a height along an axial direction parallel to the rotational axis;
wherein the first pattern extends in a single direction, the first pattern being wrapped around the first mask unit in a slant such that respective positions of the respective plurality of elements forms a helical route;
wherein the first pattern includes a respective plurality of elements with at least one open element in each of the axial direction and a circumferential direction and at least one blocking element in each of the axial direction and the circumferential direction;
a detector configured to receive radiation data from at least one source such that one of the detector and the at least one source is located inside the hollow cavity and another of the detector and the at least one source is located outside the hollow cavity; and
wherein the first mask unit is configured to move along the helical route until the first pattern is traversed and the first pattern is at least partially recorded by the detector.

2. The imaging system of claim 1, wherein:
the first mask unit is cylindrical in shape; and
the at least one open element and the at least one blocking element are configured with respective attenuation rates;
a difference between the respective attenuation rates of the at least one open element and the at least one blocking element is at or above 10%.

3. The imaging system of claim 1, further comprising:
a controller in communication with the detector and having a processor and tangible, non-transitory memory on which instructions are recorded; and
wherein execution of the instructions by the processor causes the controller to reconstruct an image of the at least one source, the image including respective pixels in the circumferential direction and the axial direction.

4. The imaging system of claim 3, wherein:
the first pattern divided into a first set and a second set such that at least 50% of the first set and at least 50% of the second set are identical; and
the first set and the second set are tiled on the surface in the axial direction.

5. The imaging system of claim 4, wherein:
the first pattern is a cyclic-difference-set-based (CDS-based) pattern.

6. The imaging system of claim 1, further comprising:
an actuator configured to move the first mask unit.

7. The imaging system of claim 1, wherein:
the detector is configured to be position sensitive.

8. The imaging system of claim 1, wherein:
the system is characterized by an absence of a collimator configured to restrict an axial field of view of the detector.

9. The imaging system of claim 1, further comprising:
a second mask unit concentric with and positioned surrounding the first mask unit;
wherein the second mask unit defines a second surface, the second mask unit being characterized by a second pattern encoded on the second surface;
wherein the second pattern includes the respective plurality of elements with another at least one open element in each of the axial direction and the circumferential direction and another at least one blocking element in each of the axial direction and the circumferential direction;
wherein the first mask unit is configured to spin relative to the rotational axis at a first frequency and the second mask unit is configured to spin relative to the rotational axis at a second frequency.

10. The imaging system of claim 9, wherein:
the first mask unit and the second mask unit have respective positions indicated by an inner mask azimuth angle ($\varphi_i$) and an outer mask azimuth angle ($\varphi_o$), respectively; and
the first mask unit and the second mask unit are configured to spin through a combination of positions ($\varphi_i$, $\varphi_o$), with the inner mask azimuth angle ($\varphi_i$) extending from 0 to $2\pi$ and the outer mask azimuth angle ($\varphi_o$) extending from 0 to $2\pi$.

11. The imaging system of claim 9, wherein:
the respective plurality of elements is arranged along a slope angle of positive alpha ($\alpha$) in the first pattern; and
the respective plurality of elements is arranged along the slope angle of beta ($\beta$) in the second pattern, where $\beta=\alpha-(\pi/2)$.

12. A method of recording radiation data in an imaging system having an actuator, the method comprising:
forming a first mask unit with a hollow cavity surrounding a rotational axis, and a surface;
encoding a first pattern on the surface of the first mask unit, the first pattern including respective plurality of elements with at least one open element in each of the axial direction and a circumferential direction and at least one blocking element in each of the axial direction and the circumferential direction, the first pattern defining a height along an axial direction parallel to the rotational axis;
configuring a detector to receive radiation data from at least one source such that one of the detector and the at least one source is located inside the hollow cavity and another of the detector and the at least one source is located outside the hollow cavity; and
moving the first mask unit, via the actuator, including sequentially rotating the first mask unit along the circumferential direction and incrementally translating the first mask unit along the axial direction until the first pattern is at least partially recorded by the detector and the height of the first pattern is traversed.

13. The method of claim 12, wherein the imaging system includes a controller in communication with the detector and having a processor and tangible, non-transitory memory on which instructions are recorded, the method further comprising:
reconstructing an image of the source in 2-D, the image including respective pixels in the circumferential direction and the axial direction.

14. The method of claim 12, further comprising:
positioning a second mask unit surrounding the first mask unit, the second mask unit being concentric with the first mask unit and defining a second surface;
encoding a second pattern on the second surface, the second pattern including the respective plurality of elements with another at least one open element in each of the axial direction and the circumferential direction and another at least one blocking element in each of the axial direction and the circumferential direction;
wherein moving the first mask unit includes spinning the first mask unit relative to the rotational axis at a first frequency; and
spinning the second mask unit relative to the rotational axis at a second frequency.

15. The method of claim 14, further comprising:
indicating respective positions of the first mask unit and the second mask unit by an inner mask azimuth angle ($\varphi_i$) and an outer mask azimuth angle ($\varphi_o$), respectively; and
spinning the first mask unit and the second mask unit through a combination of positions ($\varphi_i$, $\varphi_o$), with the inner mask azimuth angle ($\varphi_i$) extending from 0 to $2\pi$ and the outer mask azimuth angle ($\varphi_o$) extending from 0 to $2\pi$.

16. The method of claim 15, further comprising:
arranging the respective plurality of elements in the first pattern along a slope angle of positive alpha ($\alpha$); and
arranging the respective plurality of elements in the second pattern along the slope angle of negative alpha ($-\alpha$).

17. The method of claim 12, wherein:
the imaging system is characterized by an absence of a collimator configured to restrict an axial field of view of the detector.

18. An imaging system comprising:
a first mask unit having a surface and a hollow cavity surrounding a rotational axis;
an actuator configured to move the first mask unit;
wherein the first mask unit is characterized by a first pattern encoded on the surface, the first pattern defining a height along an axial direction parallel to the rotational axis;
wherein the first pattern includes a respective plurality of elements with at least one open element in each of the axial direction and a circumferential direction and at least one blocking element in each of the axial direction and the circumferential direction;
a detector configured to receive radiation data from at least one source such that one of the detector and the at least one source is located inside the hollow cavity and another of the detector and the at least one source is located outside the hollow cavity;
wherein the first pattern extends along at least two directions, including the axial direction and the circumferential direction; and
wherein the actuator is configured to sequentially rotate the first mask unit along the circumferential direction and incrementally translate the first mask unit along the axial direction until the height of the first pattern is traversed and the first pattern is at least partially recorded by the detector.

19. A method of recording radiation data in an imaging system having an actuator, the method comprising:
forming a first mask unit with a hollow cavity surrounding a rotational axis, and a surface;
encoding a first pattern on the surface of the first mask unit, including arranging the first pattern in a single direction and wrapping the first pattern around the first mask unit in a slant such that respective positions of the respective plurality of elements forms a helical route, the first pattern including respective plurality of elements with at least one open element in each of the axial direction and a circumferential direction and at least one blocking element in each of the axial direction and the circumferential direction, the first pattern defining a height along an axial direction parallel to the rotational axis;

configuring a detector to receive radiation data from at least one source such that one of the detector and the at least one source is located inside the hollow cavity and another of the detector and the at least one source is located outside the hollow cavity; and moving the first mask unit, via the actuator, along the helical route until the height of the pattern is traversed and the first pattern is at least recorded by the detector.

* * * * *